United States Patent
Cheng et al.

(10) Patent No.: US 11,301,076 B2
(45) Date of Patent: Apr. 12, 2022

(54) PIEZORESISTIVE DETECTION CIRCUIT, PIEZORESISTIVE DETECTION SUBSTRATE, DISPLAY PANEL AND DISPLAY DEVICE

(71) Applicant: BOE TECHNOLOGY GROUP CO., LTD., Beijing (CN)

(72) Inventors: ChihJen Cheng, Beijing (CN); Yuzhen Guo, Beijing (CN); Pengpeng Wang, Beijing (CN); Xiaoliang Ding, Beijing (CN); Xueyou Cao, Beijing (CN); Yanling Han, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 648 days.

(21) Appl. No.: 16/301,523

(22) PCT Filed: Feb. 11, 2018

(86) PCT No.: PCT/CN2018/076319
§ 371 (c)(1),
(2) Date: Nov. 14, 2018

(87) PCT Pub. No.: WO2019/010975
PCT Pub. Date: Jan. 17, 2019

(65) Prior Publication Data
US 2021/0232253 A1 Jul. 29, 2021

(30) Foreign Application Priority Data
Jul. 13, 2017 (CN) .......................... 201710571545.1

(51) Int. Cl.
*G06F 3/041* (2006.01)
*H01L 27/32* (2006.01)

(52) U.S. Cl.
CPC ........ *G06F 3/0414* (2013.01); *G06F 3/04166* (2019.05); *H01L 27/323* (2013.01); *H01L 27/3244* (2013.01)

(58) Field of Classification Search
None
See application file for complete search history.

(56) References Cited

U.S. PATENT DOCUMENTS

2016/0313846 A1* 10/2016 Hong ................... G06F 3/0414
2017/0003811 A1   1/2017 Lu
(Continued)

FOREIGN PATENT DOCUMENTS

CN   101996014 A   3/2011
CN   105867699 A   8/2016
(Continued)

OTHER PUBLICATIONS

International Search Report and Written Opinion dated May 10, 2018; PCT/CN2018/076319.

*Primary Examiner* — Kirk W Hermann

(57) ABSTRACT

A piezoresistive detection circuit includes a first transistor, a second transistor, a fixed resistor, and a pressure sensitive resistor, a first end of the fixed resistor is connected with a first voltage signal terminal, and a second end of the fixed resistor is connected with a first node, a first end of the pressure sensitive resistor is connected with the first node, and a second end of the pressure sensitive resistor is grounded, a gate electrode of the first transistor is connected with the first node, a source electrode of the first transistor is connected with a second voltage signal terminal, and a drain electrode of the first transistor is connected with a source electrode of the second transistor, a gate electrode of (Continued)

the second transistor is connected with a scanning signal line, and a drain electrode of the second transistor is connected with a readline.

18 Claims, 7 Drawing Sheets

(56) References Cited

U.S. PATENT DOCUMENTS

2018/0061999 A1* 3/2018 Hiraki ................ G01L 19/0092
2019/0087046 A1   3/2019 Guo et al.

FOREIGN PATENT DOCUMENTS

| CN | 106814912 A | 6/2017 |
| CN | 107168587 A | 9/2017 |
| JP | 09-204258 A | 8/1997 |
| JP | 2011-237902 A | 11/2011 |

* cited by examiner

US 11,301,076 B2

PIEZORESISTIVE DETECTION CIRCUIT, PIEZORESISTIVE DETECTION SUBSTRATE, DISPLAY PANEL AND DISPLAY DEVICE

The present application claims priority of Chinese Patent Application No. 201710571545.1 filed on Jul. 13, 2017, the disclosure of which is incorporated herein by reference in its entirety as part of the present application.

TECHNICAL FIELD

Embodiments of the present disclosure relate to a piezoresistive detection circuit, a piezoresistive detection substrate, a display panel and a display device.

BACKGROUND

The piezoresistive detection circuit refers to a circuit in which a piezoresistive resistor generates a resistance change after being pressed, and then converts the resistance change into a standard signal output. A current piezoresistive detection circuit usually includes a piezoresistive sensor, a selection switching transistor and a resistive voltage amplifier, and changes in piezoresistance may be obtained by detecting changes in output signals of the piezoresistive detection circuit, thereby obtaining pressure applied thereto.

SUMMARY

At least one embodiment of the present disclosure provides a piezoresistive detection circuit, the piezoresistive detection circuit comprises: a first transistor, a second transistor, a fixed resistor, and a pressure sensitive resistor; wherein a first end of the fixed resistor is connected with a first voltage signal terminal, and a second end of the fixed resistor is connected with a first node; a first end of the pressure sensitive resistor is connected with the first node, and a second end of the pressure sensitive resistor is grounded; a gate electrode of the first transistor is connected with the first node, a source electrode of the first transistor is connected with a second voltage signal terminal, and a drain electrode of the first transistor is connected with a source electrode of the second transistor; a gate electrode of the second transistor is connected with a scanning signal line, and a drain electrode of the second transistor is connected with a readline.

For example, in the piezoresistive detection circuit provided by at least one embodiment of the present disclosure, the first end and the second end of the pressure sensitive resistor are in a turned-off state when no pressure is applied, a resistance value of the pressure sensitive resistor decreases as a pressure applied to the pressure sensitive resistor is increased.

At least one embodiment of the present disclosure provides a piezoresistive detection substrate, the piezoresistive detection substrate comprises: a base substrate, a plurality of piezoresistive detection circuits disposed in a detection region of the base substrate, a plurality of readlines and a plurality of scanning signal lines, each of the plurality of piezoresistive detection circuits includes: a first transistor, a second transistor, a fixed resistor and a pressure sensitive resistor; wherein a first end of the fixed resistor is connected with a first voltage signal terminal, and a second end of the fixed resistor is connected with a first node; a first end of the pressure sensitive resistor is connected with the first node, and a second end of the pressure sensitive resistor is grounded; a gate electrode of the first transistor is connected with the first node, a source electrode of the first transistor is connected with a second voltage signal terminal, and a drain electrode of the first transistor is connected with a source electrode of the second transistor; a gate electrode of the second transistor is connected with the scanning signal line, and a drain electrode of the second transistor is connected with the readline.

For example, in the piezoresistive detection substrate provided by at least one embodiment of the present disclosure, the plurality of piezoresistive detection circuits are arranged in an array; each column of the plurality of piezoresistive detection circuits is connected with a same readline, and each row of the piezoresistive detection circuits is connected with a same scanning signal line; or each row of the piezoresistive detection circuits is connected with a same readline, and each column of the piezoresistive detection circuits is connected with a same scanning signal line.

For example, the piezoresistive detection substrate provided by at least one embodiment of the present disclosure further comprises: a constant current source, an amplifier, and an analog to digital converter disposed in a non-detection region of the base substrate; wherein an end of each of the readlines is connected with the constant current source in a one-to-one correspondence to the readline, and an end of each of the readlines is connected with an input end of the amplifier in a one-to-one correspondence to the readline; an output end of the amplifier is connected with an input end of the analog to digital converter.

For example, the piezoresistive detection substrate provided by at least one embodiment of the present disclosure further comprises an acquiring circuit, wherein the output end of the amplifier is connected with an input end of the acquiring circuit; the output end of the acquiring circuit is connected with the input end of the analog to digital converter.

For example, in the piezoresistive detection base provided by at least one embodiment of the present disclosure, the acquiring circuit includes: a switching member and a capacitor; wherein an end of the switching member is connected with the output end of the amplifier, and an other end of the switching member is used as an output end and grounded through the capacitor.

For example, in the piezoresistive detection substrate provided by at least one embodiment of the present disclosure, the plurality of acquiring circuits are connected with one of the analog to digital converters, the switching members in the plurality of acquiring circuits connected with the same analog to digital converter are turned on in a time division way.

For example, in the piezoresistive detection substrate provided by at least one embodiment of the present disclosure, one of the acquiring circuits is connected with one of the analog to digital converters.

For example, in the piezoresistive detection substrate provided by at least one embodiment of the present disclosure, the first end and the second end of the pressure sensitive resistor are in a turned-off state when no pressure is applied, a resistance value of the pressure sensitive resistor decreases as a pressure applied to the pressure sensitive resistor is increased.

At least one embodiment of the present disclosure provides a display panel, the display panel comprises the above piezoresistive detection circuit or the above piezoresistive detection substrate, and a plurality of pixel circuits disposed in a display region of the base substrate.

For example, in the display panel provided by at least one embodiment of the present disclosure, a display region and the detection region of the base substrate are a same region; the pixel circuit includes: a switching transistor, a driving transistor and an organic light emitting diode; the organic light emitting diode is disposed on the switching transistor and the driving transistor; source and drain electrodes of the switching transistor, source and drain electrodes of the driving transistor, source and drain electrodes of the first transistor, and source and drain electrodes of the second transistor are disposed in a source and drain metal layer in a same layer; an active layer of the switching transistor, an active layer of the driving transistor, an active layer of the first transistor, and an active layer of the second transistor are disposed in a semiconductor layer in a same layer; the source and drain metal layer is disposed between the semiconductor layer and the organic light emitting diode.

For example, in the display panel provided by at least one embodiment of the present disclosure, the fixed resistor and the pressure sensitive resistor are disposed between the base substrate and the semiconductor layer; the display panel further comprises: a plurality of first electrodes connected with first ends of the fixed resistors in one-to-one correspondence relationships, each of the plurality of first electrodes used as the first voltage signal terminal; a ground electrode connected with a second end of the pressure sensitive resistor; a plurality of second electrodes respectively connected with the second ends of the fixed resistors and the first ends of the piezoresistive resistors in a one-to-one correspondence relationship, each of the second electrodes serving as a first node.

For example, in the display panel provided by at least one embodiment of the present disclosure, the ground electrode, the pressure sensitive resistor, the second electrode, the fixed resistor and the first electrode are stacked on the base substrate sequentially.

For example, in the display panel provided by at least one embodiment of the present disclosure, a gate electrode of the switching transistor and a gate electrode of the driving transistor are disposed in a gate metal layer in a same layer, the gate metal layer is disposed between the source and drain metal layer and the semiconductor layer; the first electrode is disposed between the semiconductor layer and the fixed resistor; each of the second electrodes partially overlaps with the fixed resistor, and a portion of the second electrode overlaps with an active layer of the first transistor and is used as a gate electrode of the first transistor.

For example, in the display panel provided by at least one embodiment of the present disclosure, each of the first transistors further includes a floating gate electrode disposed in the gate metal layer.

For example, in the display panel provided by at least one embodiment of the present disclosure, a gate electrode of the switching transistor, a gate electrode of the driving transistor, a gate electrode of the first transistor and a gate electrode of the second transistor are disposed in a gate metal layer in a same layer, and the gate metal layer is disposed between the semiconductor layer and the second electrode; the fixed resistor is disposed between the gate metal layer and the second electrode; the second electrode partially overlaps with the fixed resistor, and partially overlaps with a gate electrode of the first transistor and connected to the gate electrode of the first transistor through a via hole.

For example, in the display panel provided by at least one embodiment of the present disclosure, each of the first electrode is disposed in the source and drain metal layer or in the gate metal layer.

At least one embodiment of the present disclosure provides a display device comprising the display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Figure 1:
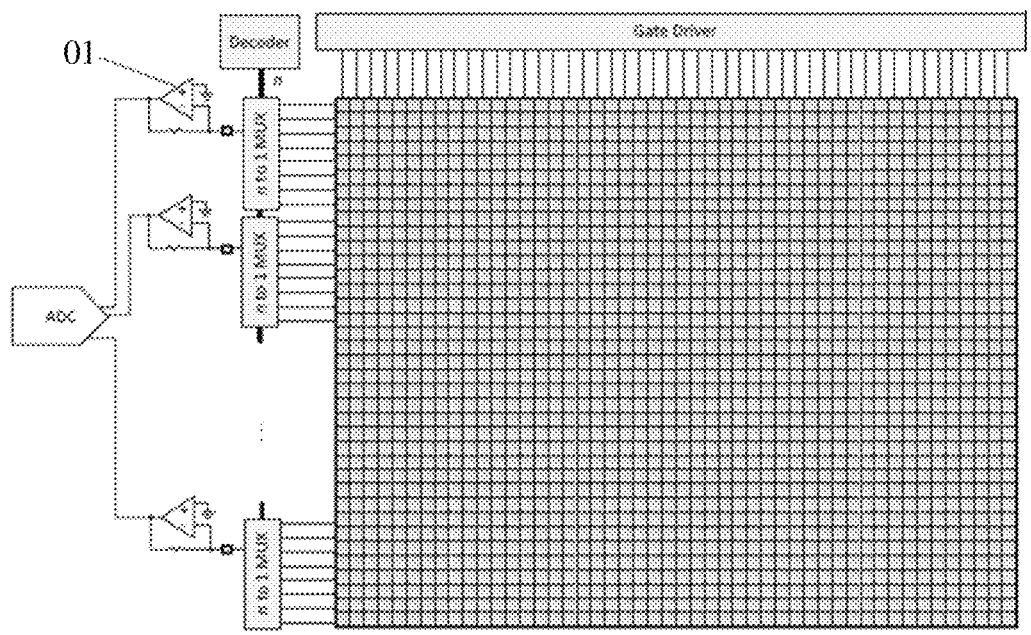
FIG. 1 is a structural schematic diagram of an array type piezoresistive sensor.

FIG. 1 is a structural schematic diagram of an array type piezoresistive sensor. As shown in FIG. 1, the array type piezoresistive sensor includes a gate driver, an analog circuit 01 and a plurality of piezoresistive detection circuits. The plurality of piezoresistive detection circuits are disposed in a detection region and arranged in an array; the gate driver is disposed in a non-detection region to row-by-row scan the plurality of scanning signal lines in the detection region; and the analog circuit is disposed in the non-detection region, to convert and read signal of a plurality of readlines in the detection region through a demultiplexer MUX.

Figure 2:
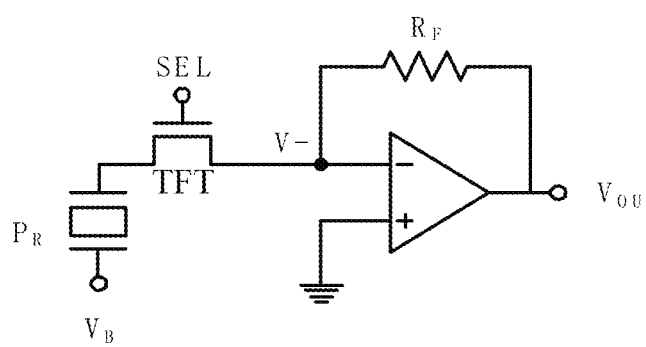
FIG. 2 is a schematic diagram of a circuit structure of a piezoresistive detection circuit.

FIG. 2 is a schematic diagram of a piezoresistive detection circuit. As shown in FIG. 2, the piezoresistive detection circuit is composed of a piezoresistive sensor $P_R$, a selection switch TFT and a resistive voltage amplifier; a resistance of the piezoresistive sensor $P_R$ is $R_X$, and an output voltage $V_{OU}$ of the piezoresistive detection circuit is $R_F/R_X \times V_B$, and therefore, changes in piezoresistance may be obtained by detecting changes in the output $V_{OU}$.

Inventors found in researches that, since the piezoresistive sensor $P_R$ in the piezoresistive detection circuit described above performs a detection output after being connected with the resistive voltage amplifier, the piezoresistive detection circuit is in a normally open state, and thus current often leaks, for example, during operation, leakage current of $N \times V_B/R_X$ may be generated, where N is a number of piezoresistive detection circuit columns, resulting in large leakage current during the piezoresistive detection process, which is not conducive to accuracy of a final detection result. Moreover, since the selection switch TFT, a wiring resistor and the piezoresistive sensor $P_R$ in the piezoresistive detection circuit are in series, a resistance of the selection switch TFT is related to characteristics of the device per se, and the wiring resistance is related to a length of wire, the measured output may be unstable, resulting in errors in the final detection result.

At least one embodiment of the present disclosure provides a piezoresistive detection circuit, comprising: a first transistor, a second transistor, a fixed resistor and a pressure sensitive resistor; a first end of the fixed resistor is connected with a first voltage signal terminal, and a second end is connected with a first node; a first end of the pressure sensitive resistor is connected with the first node, and a second end is grounded; a gate electrode of the first transistor is connected with the first node, a source electrode is connected with a second voltage signal terminal, and a drain electrode is connected with a source electrode of the second transistor; and a gate electrode of the second transistor is connected with a scanning signal line, and a drain electrode is connected with a readline. When the piezoresistive detection circuit acquires a pressure, the second transistor may be turned on through the scanning signal line, and at this time, an electric potential of the first node may control a voltage size of the first voltage signal terminal flowing through the first transistor, so as to control a magnitude of a voltage signal transmitted to the readline connected with the drain electrode of the second transistor, and thus pressure condition of the piezoresistive detection circuit may be determined by judging the magnitude of the voltage signal output from the readline, and influence of a threshold voltage of the first transistor on the read voltage signal may be eliminated by determining changes in the voltage signal read by the readline before being touched and after being touched, thereby, accuracy of detection may be improved. Moreover, the second transistor is turned on only during the acquisition detection, so that the piezoresistive detection circuit is actively detected, and is less susceptible to leakage current, thereby improving sensitivity of the pressure sensitive detection.

Hereinafter, implementation modes of the piezoresistive detection circuit, the piezoresistive detection substrate, the display panel and the display device provided by the embodiments of the present disclosure are described in detail in conjunction with the accompanying drawings.

In the drawings, thicknesses of the respective layers of films and sizes of regions do not reflect real proportion of the array substrate or the color filter substrate, and the objective is only to schematically illustrate the present disclosure.

Figure 3:
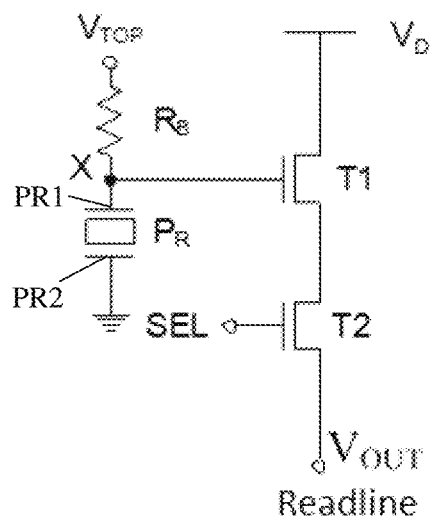
FIG. 3 is a structural schematic diagram of a piezoresistive detection circuit provided by an embodiment of the present disclosure.

An embodiment of the present disclosure provides a piezoresistive detection circuit, and as shown in FIG. 3, a piezoresistive detection circuit 200 comprises: a first transistor T1, a second transistor T2, a fixed resistor $R_B$ and a pressure sensitive resistor $P_R$; a first end of the fixed resistor $R_B$ is connected with a first voltage signal terminal $V_{TOP}$, and a second end is connected with a first node X; a first end of the pressure sensitive resistor $P_R$ is connected with the first node X, and a second end is grounded; a gate electrode of the first transistor T1 is connected with the first node X, a source electrode is connected with a second voltage signal terminal $V_{DD}$, and a drain electrode is connected with a source electrode of the second transistor T2; and a gate electrode of the second transistor T2 is connected with a scanning signal line SEL, and a drain electrode is connected with a readline.

For example, in the piezoresistive detection substrate provided by the embodiment, when the pressure of the piezoresistive detection circuit 200 is acquired, the second transistor T2 is turned on through the scanning signal line SEL connected with the gate electrode of the second transistor T2, and at this time, an electric potential of the first node X connected with the gate electrode of the first transistor T1 may control a voltage size of the first voltage signal terminal $V_{DD}$ flowing through the first transistor T1, so as to control a magnitude of a voltage signal transmitted to the readline connected with the drain electrode of the second transistor T2. Pressure condition of the piezoresistive detection circuit 200 may be determined by judging the magnitude of the voltage signal output from the readline.

Figure 6:
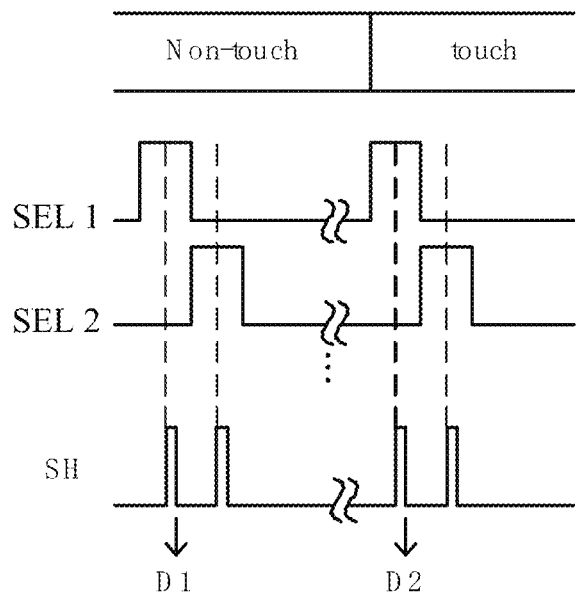
FIG. 6 is a time sequence diagram of a piezoresistive detection substrate provided by an embodiment of the present disclosure.

For example, in conjunction with a timing diagram shown in FIG. 6, an operation time sequence of the piezoresistive detection substrate provided by an embodiment of the present disclosure may be described in detail. Before a touch pressure sensitive detection is performed (non-touch), that is, in an initial state where no pressure is applied, the piezoresistive detection circuit 200 is subjected to signal acquisition at first. Since the pressure sensitive resistor $P_R$ is in an open state before being pressed, a gate voltage of the first transistor T1, that is, a voltage of the first node X is a voltage value of the first voltage signal terminal $V_{TOP}$; since there is a threshold voltage $V_{TH}$ of the first transistor T1, when the scan signal line SEL 1 is switched on, the second transistor T2 is turned on, and a voltage signal acquired by the readline is $V_{TOP}-V_{TH}$, that is, the readline may acquire the threshold voltage of the first transistor T1. When a touch detection is performed (touch), the resistance of the pressure sensitive resistor $P_R$ in the piezoresistive detection circuit 200 is changed to $R_R$ after being pressed, so that a dividing voltage is generated on the first node X, and by calculation, the voltage of the first node X may be obtained and change into $V_{TOP} \times R_R/(R_B+R_R)$; since there is the threshold voltage $V_{TH}$ of the first transistor T1, when the scanning signal line SEL 1 is switched on, the second transistor T2 is turned on, and the voltage signal acquired by the readline is $V_{TOP} \times R_R/(R_B+R_R)-V_{TH}$. A difference between the voltage signals acquired by the readline at the two times is $V_{TOP} \times R_B/(R_B+R_R)$, and influence of the threshold voltage of the first transistor T1 is eliminated, and the obtained voltage difference is only affected by a resistance value of the pressure sensitive resistor $P_R$ caused by changes in the applied pressure. Therefore, the changes in the pressure may be deduced by the changes in the voltage difference, and the detected voltage difference has eliminated the influence of the threshold voltage of the first transistor T1, thereby, accuracy of the detection may be improved, and moreover, the second transistor T2 is turned on only during the acquisition detection, so that the piezoresistive detection circuit 200 is actively detected, and is not susceptible to leakage current, thereby improving sensitivity of the pressure sensitive detection.

For example, in the present embodiment, the pressure sensitive resistor $P_R$ may be configured to be turned off when the first end and the second end of the pressure sensitive resistor $P_R$ are not applied with pressure, and to be turned on when the first end PR1 and the second end PR2 of the pressure sensitive resistor $P_R$ are applied with pressure, and moreover, a resistance value of the pressure sensitive resistor $P_R$ may be decreased as the applied pressure is increased by selecting material of the pressure sensitive resistor $P_R$. That is, the greater the pressure is, the smaller the resistance value of the pressure sensitive resistor $P_R$ is, and in this way, the larger the voltage of the first node X is, the smaller the voltage signal output from the readline is, the larger the difference between the voltage signal and initial voltage signal output by the readline in the initial state is, that is, when no pressure is applied, and thus, the greater the sensed changes in pressure is.

Figure 4:
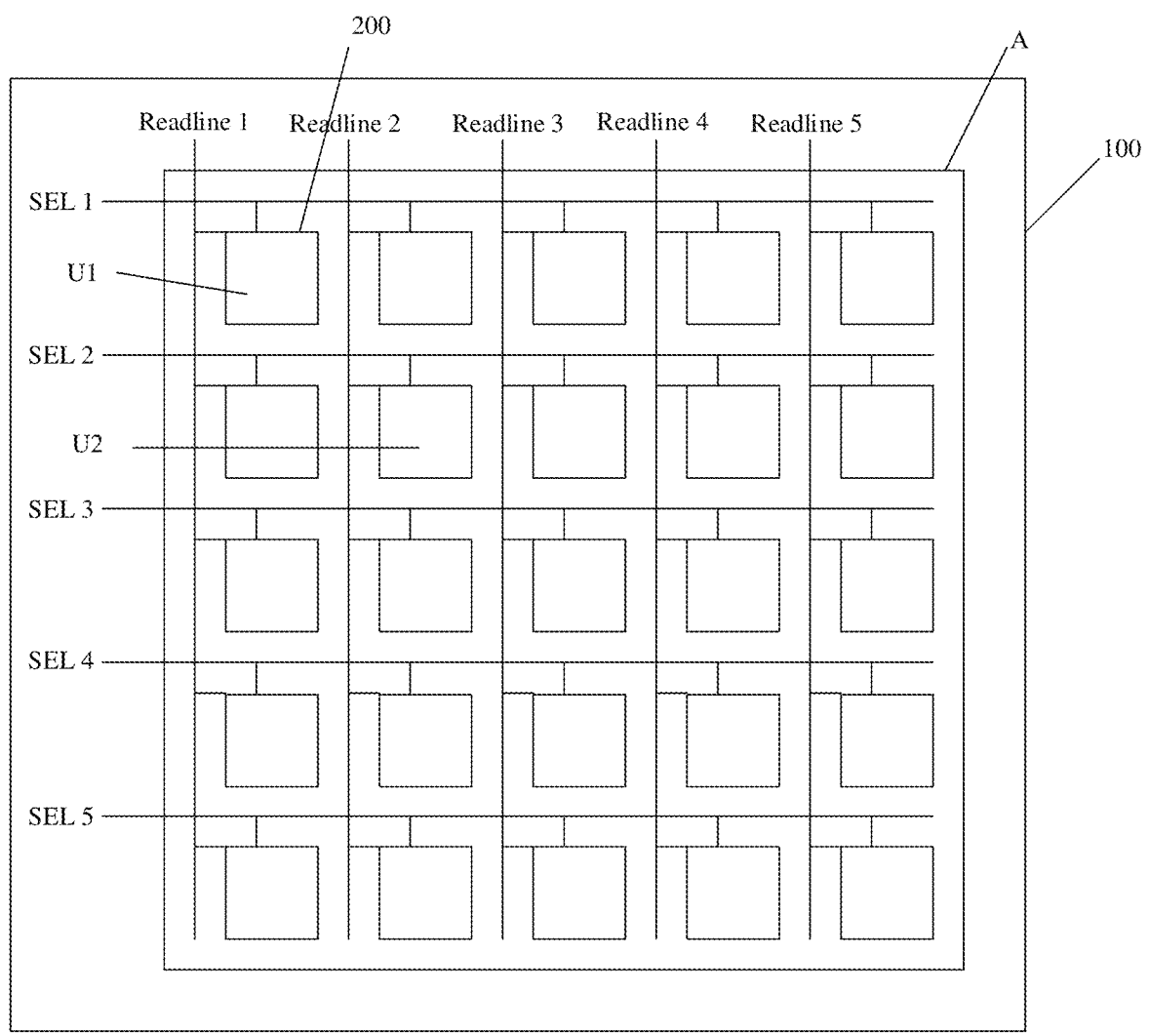
FIG. 4 is a structural schematic diagram of a piezoresistive detection substrate provided by an embodiment of the present disclosure.
Figure 5:
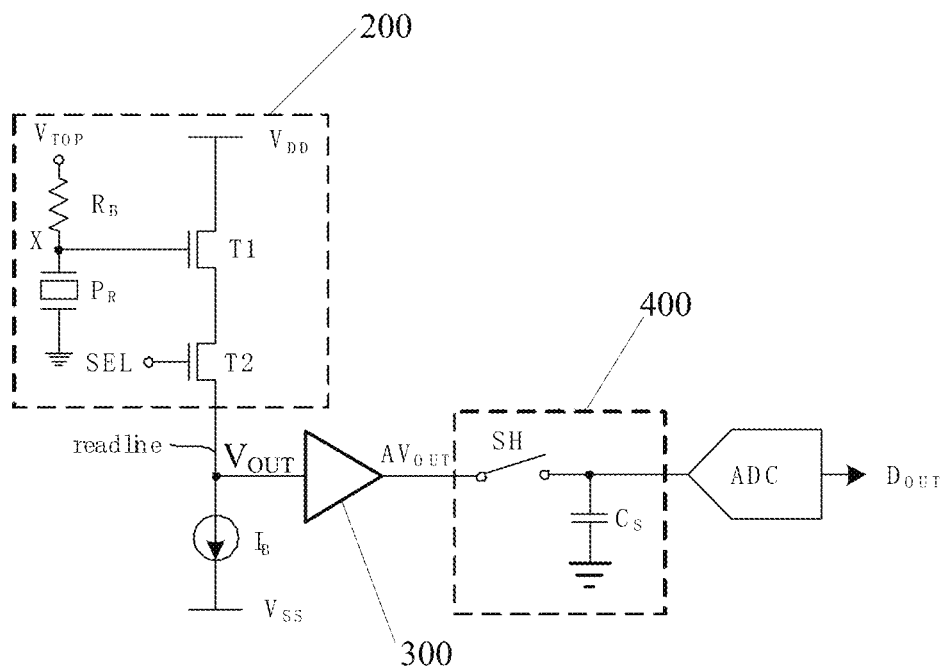
FIG. 5 is a schematic diagram of a circuit structure of a piezoresistive detection substrate provided by an embodiment of the present disclosure.

An embodiment of the present disclosure provides a piezoresistive detection substrate, and as shown in FIG. 4, the piezoresistive detection substrate comprises: a base substrate 100, a plurality of piezoresistive detection circuits disposed in a detection region A of the base substrate 100, a plurality of readlines and a plurality of scanning signal lines SEL. For example, as shown in FIG. 5, each of the piezoresistive detection circuits includes a first transistor T1, a second transistor T2, a fixed resistor $R_B$ and a pressure sensitive resistor $P_R$. For example, a first end of the fixed resistor $R_B$ is connected with a first voltage signal terminal $V_{TOP}$, and a second end is connected with a first node X; a first end of the pressure sensitive resistor $P_R$ is connected with the first node X, and a second end is grounded; a gate electrode of the first transistor T1 is connected with the first node X, a source electrode is connected with a second voltage signal terminal $V_{DD}$, and a drain electrode is connected with a source electrode of the second transistor T2; and a gate electrode of the second transistor T2 is connected with the scanning signal line SEL, and a drain electrode is connected with the readline.

For example, in the piezoresistive detection substrate provided by the embodiment, when pressure on a piezoresistive detection circuit 200 is acquired, the second transistor T2 is turned on through the scanning signal line SEL connected with the gate electrode of the second transistor T2, and at this time, an electric potential of the first node X connected with the gate electrode of the first transistor T1 may control a voltage size of the first voltage signal terminal $V_{DD}$ flowing through the first transistor T1, so as to control a magnitude of a voltage signal transmitted to the readline connected with the drain electrode of the second transistor T2. Pressure condition of the piezoresistive detection circuit 200 may be determined by judging the magnitude of the voltage signal output from the readline.

For example, one readline may read pressure sensitive signals of the plurality of piezoresistive detection circuits 200 in a time division way by the second transistor T2 disposed in each of the piezoresistive detection circuits 200.

For example, in conjunction with a timing diagram shown in FIG. 6, an operation time sequence of the piezoresistive detection substrate provided by the embodiment of the present disclosure may be described in detail. Before a touch pressure sensitive detection is performed (non-touch), that is, in an initial state where no pressure is applied, each of the piezoresistive detection circuits 200 in the piezoresistive detection base is subjected to signal acquisition at first. One of the piezoresistive detection circuits 200 is taken as an example, since the pressure sensitive resistor $P_R$ is in an open state before being pressed, a gate voltage of the first transistor T1, that is, a voltage of the first node X is a voltage value of the first voltage signal terminal $V_{TOP}$; since there is a threshold voltage $V_{TH}$ of the first transistor T1, when the scanning signal line SEL 1 is switched on, the second transistor T2 is turned on, and a voltage signal acquired by the readline is $V_{TOP}-V_{TH}$, that is, the readline may acquire the threshold voltage of the first transistor T1. When a touch detection is performed (touch), the resistance of the pressure sensitive resistor $P_R$ in the piezoresistive detection circuit 200 is changed to $R_R$ after being pressed, so that a dividing voltage is generated on the first node X, and by calculation, the voltage of the first node X may be obtained and change into $V_{TOP} \times R_R/(R_B+R_R)$; since there is the threshold voltage $V_{TH}$ of the first transistor T1, when the scanning signal line SEL 1 is switched on, the second transistor T2 is turned on, and the voltage signal acquired by the readline is $V_{TOP} \times R_R/(R_B+R_R)-V_{TH}$. A difference between the voltage signals acquired by the readline in the two times is $V_{TOP} \times R_B/(R_B+R_R)$, and influence of the threshold voltage of the first transistor T1 is eliminated, and the obtained voltage difference is only affected by a resistance value of the pressure sensitive resistor $P_R$ caused by changes in the applied pressure. Therefore, the changes in the pressure may be deduced by the changes in the voltage difference, and the detected voltage difference has eliminated the influence of the threshold voltage of the first transistor T1, thereby, accuracy of the detection may be improved, and moreover, the second transistor T2 is turned on only during the acquisition detection, so that the piezoresistive detection circuit 200 is actively detected, and is not susceptible to leakage current, thereby improving sensitivity of the pressure sensitive detection.

For example, in the piezoresistive detection substrate provided by the embodiment, the first end and the second end of the pressure sensitive resistor $P_R$ are turned off when no pressure is applied, and the first end and the second end of the pressure sensitive resistor $P_R$ are turned on when the pressure is applied, and moreover, a resistance value of the pressure sensitive resistor $P_R$ may be decreased as the applied pressure is increased by selecting a material of the pressure sensitive resistor $P_R$. That is, the greater the pressure is, the smaller the resistance value of the pressure sensitive resistor $P_R$ is, and in this way, the larger the voltage of the first node X is, the smaller the voltage signal output from the readline is, the larger the difference between the voltage signal and initial voltage signal output by the readline in the initial state is, that is, when no pressure is applied, and thus, the greater the sensed changes in pressure is.

For example, in the piezoresistive detection substrate provided by the embodiment, the piezoresistive detection circuits, for example, may be arranged in an array, to improve effective detection area of a detection region and reduce complexity of wiring, and as shown in FIG. 4, the plurality of piezoresistive detection circuit 200 are arranged in an array; and at this time, each of the readlines and each of the scanning signal lines SEL may be connected with the plurality of piezoresistive detection circuits 200. For example, each column of the piezoresistive detection circuits 200 may be connected with a same readline, and each row of the piezoresistive detection circuits 200 may be connected with a same scanning signal line SEL; or, each row of the piezoresistive detection circuits 200 may be connected with a same readline, each column of the piezoresistive detection circuits 200 may be connected with a same scanning signal line SEL, so that a number of wirings of the readlines and the scanning signal lines SEL may be reduced. At this time, for example, a voltage signal of each of the readlines may be acquired by a row-by-row scanning method, to determine changes in pressure of each of the piezoresistive detection circuits 200; or, a voltage signal of each of the readlines may be acquired by scanning column by column, to determine changes in pressure of each of the piezoresistive detection circuits 200.

For example, as shown in FIG. 5, two the piezoresistive detection circuits 200 are shown, which are U1 and U2 corresponding to U1 and U2 in FIG. 4, for clearness, only two piezoresistive detection circuits are shown for the sake of simplicity, the plurality of piezoresistive detection circuits 200 will be arranged as the same way as the FIG. 5. The piezoresistive detection substrate provided by the embodiment may further include: a constant current source $I_B$ disposed in a non-detection region, an amplifier 300 and an analog to digital converter ADC for the U1, a constant current source $I_{B1}$ disposed in a non-detection region, an amplifier 301 and an analog to digital converter ADC1 for the U2. For example, in one example, the piezoresistive detection substrate may further include an acquiring circuit 400 connected between the amplifier 300 and the analog to digital converter ADC, the piezoresistive detection substrate may further include an acquiring circuit 401 connected between the amplifier 301 and the analog to digital converter ADC1. For example, when the voltage signal output by the piezoresistive detection circuit 200 is small, the circuit structure described above may ensure that the voltage signal read by each of the readlines may be effectively detected.

For example, one end RL1 of each readline is connected with a constant current source $I_B$ in a one-to-one correspondence thereto, and one end RL1 of each readline is connected with an input end of the amplifier 300 in one-to-one correspondence thereto. The amplifier 300 is responsible for magnifying the voltage signal $V_{OUT}$ output from the readline by A times, to ensure that changes in the voltage caused by pressing may be effectively recognized.

For example, an output end of amplifier 300 is connected with an input end of acquiring circuit 400. The acquiring circuit 400 is responsible for outputting the voltage signal $AV_{OUT}$ amplified by A times by the amplifier 300 to the analog to digital converter ADC of the back end.

For example, the output end of the acquiring circuit 400 is connected with an input end of the analog to digital converter ADC. The analog to digital converter ADC is responsible for converting the received analog voltage signal into a digital signal $D_{OUT}$ for outputting.

For example, in the piezoresistive detection substrate provided by the embodiment, and as shown in FIG. 5, the acquiring circuit 400 may include a switching member SH and a capacitor Cs. For example, an end of the switching member SH is connected with the output end of the amplifier 300, and the other end of the switching member SH is used as an output end and grounded through the capacitor Cs. For example, the acquiring circuit 400 may output the voltage signal $AV_{OUT}$ amplified by A times by the amplifier 300 to the analog to digital converter ADC of the back end when the switching member SH is turned on; and when the switching member SH is turned off, the amplifier 30 and the analog to digital converter ADC are not connected with each other. For example, in combination with the time sequence diagram shown in FIG. 6, the analog to digital converter ADC may output a corresponding value when the switching member SH is turned on, changes in the voltage of the first node may be obtained by subtracting D2 output in the touch detection to D1 output before the touch detection (non-touch), thereby judging whether there is a touch.

For example, in the piezoresistive detection substrate provided by the embodiment, a plurality of acquiring circuits 400 may be connected with one analog to digital converter ADC; in this case, the switching devices SH in the acquiring circuits 400 connected with the same analog to digital converter ADC may be configured to be turned on in a time-division way, to output voltage signals of the plurality of readlines in a time-division way by one analog to digital converter ADC, thereby reducing a number of the analog to digital converters ADC and saving costs.

For example, in the piezoresistive detection substrate provided by the embodiment, as shown in FIG. 5, one acquiring circuit 400 may be connected with one analog to digital converter ADC. For example, when a number of readlines in the piezoresistive detection substrate is small, one acquiring circuit 400 may be connected with one analog to digital converter ADC.

An embodiment of the present disclosure further provides a display panel 3000, which comprises: the piezoresistive detection circuit or the piezoresistive detection substrate 2000 (shown in FIG. 9) provided by the embodiments of the present disclosure, and a plurality of pixel circuits disposed in a display region of a base substrate.

For example, the display panel provided by an embodiment of the present disclosure may simultaneously integrate functions of piezoresistive detection and display. In the embodiment, for example, a detection region of the piezoresistive detection may be set according to actual needs. For example, the detection region of the piezoresistive detection may be set in a partial region of a non-display region as needed, to realize a function such as a pressure sensitive touch button, or the detection region may be set in the display region, to realize the touch function by using the piezoresistive detection while displaying, which is not limited in the embodiment.

Figure 7:
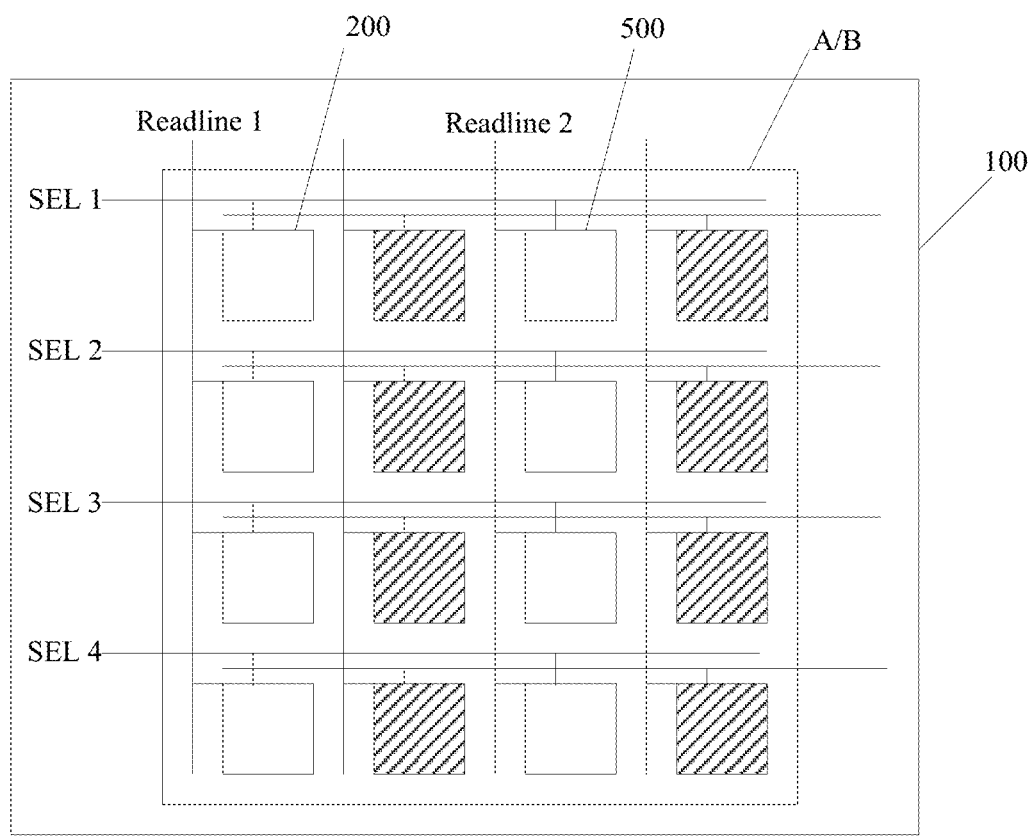
FIG. 7 is a schematic diagram of a planar structure of a display panel provided by an embodiment of the present disclosure.

For example, in the display panel provided by the embodiment, as shown in FIG. 7, a display region B and a detection region A of a base substrate 100 may be set to a same region, that is, the touch and display functions are implemented in the same region. For example, a pixel circuit 500 for realizing display and a piezoresistive detection circuit 200 for realizing pressure sensitive touch may be formed in the same region. For example, the piezoresistive detection circuit 200 may be disposed between the pixel circuits 500, so that the piezoresistive detection circuit 200 does not affect normal display of the pixel circuit 500. For example, a number of piezoresistive detection circuits 200 is not greater than a number of pixel circuits 500.

Figure 8:
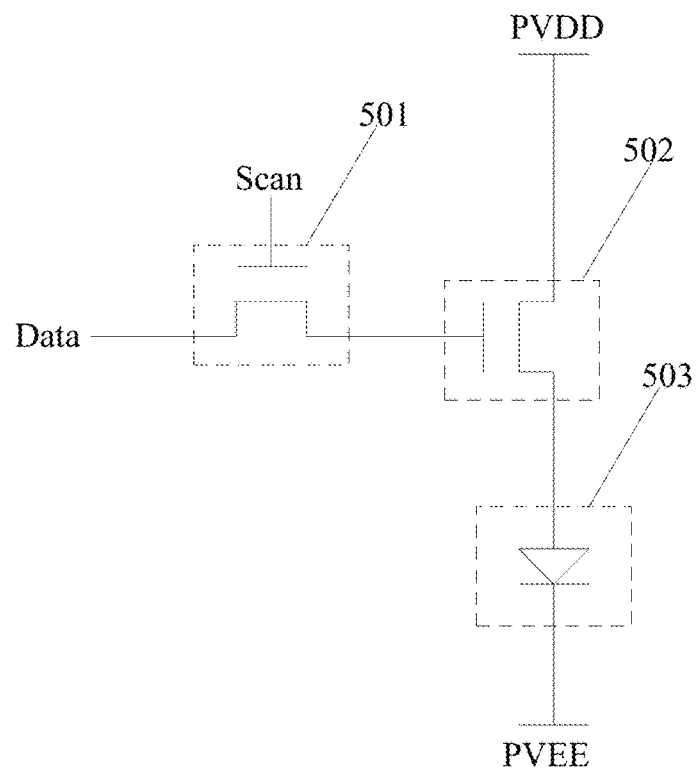
FIG. 8 is a schematic circuit diagram of a pixel circuit in a display panel provided by an embodiment of the present disclosure.

For example, in the display panel provided by the embodiment, as shown in FIG. 8, the pixel circuit 500 may include a switching transistor 501, a driving transistor 502, and an organic light emitting diode 503. For example, the pixel circuit 500 may include a plurality of switching transistors 501 and a plurality of driving transistors 502. The number of the switching transistor 501 and the number of the driving transistor 502 are not limited in the embodiment. For example, FIG. 8 shows a structure of a pixel circuit 500, and in practical applications, for example, a plurality of switching transistors 501 and driving transistors 502 may be arranged as needed to realize a threshold voltage compensation function.

Figure 9:
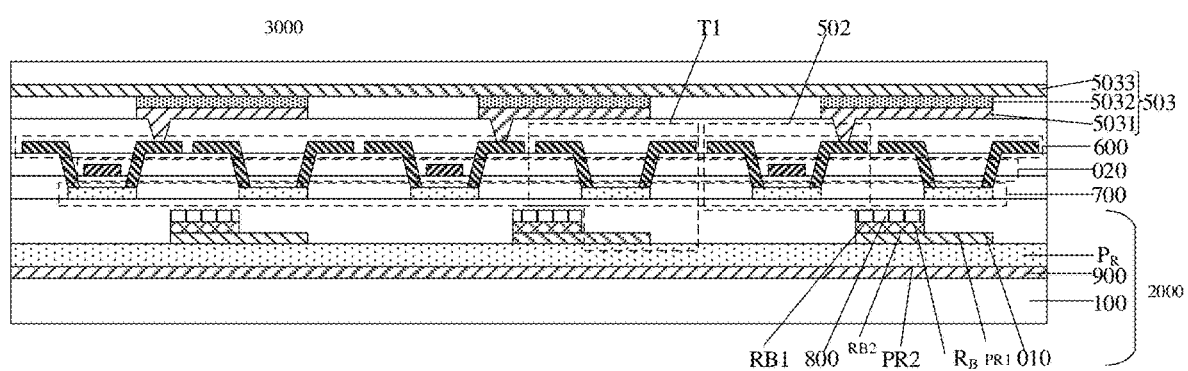
FIG. 9 is a schematic cross-sectional diagram of a display panel provided by an embodiment of the present disclosure.
Figure 10:
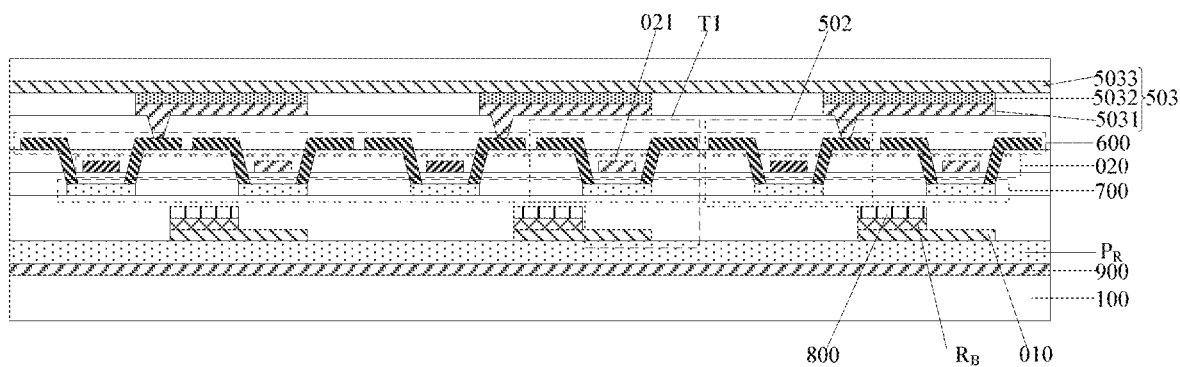
FIG. 10 is a schematic cross-sectional diagram of a display panel provided by another embodiment of the present disclosure.
Figure 11:
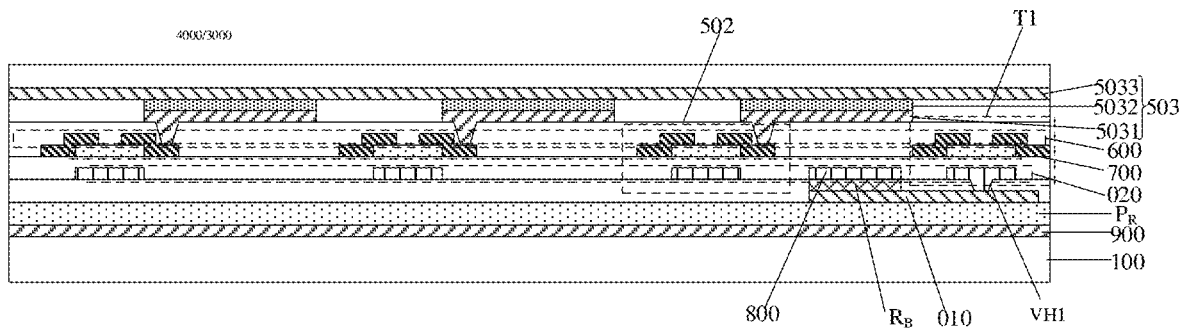
FIG. 11 is a schematic cross-sectional diagram of a display panel provided by still another embodiment of the present disclosure

FIGS. 9 to 11 are schematic cross-sectional diagrams of a display panel according to some embodiments of the present disclosure. For example, the organic light emitting diode 503 may be disposed on the switching transistor 501 and the driving transistor 502. The organic light emitting diode 503 at least includes an anode 5031, a light emitting layer 5032 and a cathode 5033 which are stacked together, for example, the cathode 5033 may be disposed as a whole layer. In some embodiments, the organic light emitting diode 503 may be, for example, a bottom emission type, that is, light is emitted from the cathode 5033 of the organic light emitting diode 503 and reflected by the anode 5031.

It should be noted that, for convenience of illustration, the switching transistor 501 and the second transistor T2 are not shown in the cross-sectional structural schematic diagrams of the display panel shown in FIGS. 9 to 11, structures of the two transistors may be referred to that of the driving transistor 502.

For example, as shown in FIG. 9 to FIG. 11, source and drain electrodes of the switching transistor 501, source and drain electrodes of the driving transistor 502, source and drain electrodes of the first transistor T1 and source and drain electrodes of the second transistor T2 may be disposed in a source and drain metal layer 600 in a same layer. For example, an active layer of the switching transistor 501, an active layer of the driving transistor 502, an active layer of the first transistor T1 and an active layer of the second transistor T2 may be disposed in a semiconductor layer 700 in a same layer, such arrangement may save production process steps. For example, the source and drain metal layer 600 may be disposed between the semiconductor layer 700 and the organic light emitting diode 503, that is, the switching transistor 501, the driving transistor 502, the first transistor T1 and the second transistor T2 are all disposed between the organic light emitting diode 503 and the base substrate 100.

For example, in the display panel provided by the embodiment, a second end of the fixed resistor $R_B$ and a first end of the piezoresistive resistor $P_R$ in the piezoresistive detection circuit 200 are connected with a gate electrode of the first transistor T1 through the first node X; and therefore, as shown in FIG. 9 to FIG. 11, for example, the fixed resistor $R_B$ and the pressure sensitive resistor $P_R$ may be disposed between the base substrate 100 and the semiconductor layer 700, that is, the fixed resistor $R_B$ and the pressure sensitive resistor $P_R$ are disposed under the semiconductor layer 700.

For example, as shown in FIG. 9 to FIG. 11, the display panel provided by the embodiment may further include a plurality of first electrodes 800 connected with the first ends RB1 of the fixed resistors $R_B$ in a one-to-one correspondence relationship, and each of the first electrodes 800 may be used, for example, as a first voltage signal terminal $V_{TOP}$, ensuring that a first voltage signal is applied to the first end of the fixed resistor $R_B$ by the first voltage signal terminal $V_{TOP}$.

For example, as shown in FIG. 9 to FIG. 11, the display panel provided by the embodiment may further include a ground electrode 900 connected with a second end PR2 of the pressure sensitive resistor PR to ensure that the second end of the pressure sensitive resistor PR are grounded.

For example, as shown in FIG. 9 to FIG. 11, the display panel provided by the embodiment may further include a plurality of second electrodes 010 connected with the second end RB2 of each of the fixed resistors $R_B$ and the first end PR1 of each of the pressure sensitive resistors $P_R$ respectively in a one-to-one correspondence relationship, and each of the second electrodes 010 may be used as the first node X, for example.

For example, in the display panel provided by the embodiment, the fixed resistor $R_B$ may be disposed under the pressure sensitive resistor $P_R$, or the pressure sensitive resistor $P_R$ may be disposed under the fixed resistor $R_B$, and in the embodiment, specific positional relationship between the fixed resistor $R_B$ and the pressure sensitive resistor $P_R$ is not limited. For example, each of the pressure sensitive resistors $P_R$ may be configured as a whole layer of pressure sensitive material, and corresponding ground electrode 900 may also be configured as a whole layer of electrode, thereby functioning as a shield electrode.

For example, in the display panel provided by the embodiment, as shown in FIG. 9 to FIG. 11, the ground electrode 900, the piezoresistive resistor $P_R$, the second electrode 010, the fixed resistor $R_B$ and the first electrode 800 may be sequentially stacked on the base substrate 100.

For example, in the display panel provided by the embodiment, each of the second electrodes 010 is as the first node X and connected with the gate electrode of the first transistor T1, and the second electrode 010 is disposed under the fixed resistor $R_B$, and thus is also located under the semiconductor layer 700, and for example, as shown in FIG. 11, the first transistor T1 may be disposed as a bottom gate type transistor, that is, the gate electrode of the first transistor T1 is located under the semiconductor layer 700, thereby facilitating the second electrode 010 to connect with the gate electrodes of the first transistor T1.

It should be noted that the embodiment does not limit the types of the switching transistor 501 and the driving transistor 502, which may be used a top gate type transistor or a bottom gate type transistor.

For example, in the display panel provided by the embodiment, when the switching transistor 501 and the driving transistor 502 are top gate type transistors, as shown in FIG. 9 and FIG. 10, a gate electrode of the switching transistor 501 and a gate electrode of the driving transistor 502, for example, may be disposed in a gate metal layer 020 in a same layer, and the gate metal layer 020 is disposed between the source and drain metal layer 600 and the semiconductor layer 700, and at this time, the first electrode 800 may be disposed between the semiconductor layer 700 and the fixed resistor $R_B$.

For example, the second electrode 010 may partially overlap with the fixed resistor $R_B$, and partially overlap with an active layer of the first transistor T1 as a gate electrode of the first transistor T1, that is, a gate pattern of the first transistor T1 is not separately disposed, but a portion of the second electrode 010 is directly used as the gate electrode of the first transistor T1.

For example, in the display panel provided by the embodiment, when the first transistors T1 are top gate type transistors, as shown in FIG. 10, a floating gate electrode 021 may further be disposed in a position corresponding to an active layer of the first transistor T1 in the gate metal layer 020, to block influence of light emitted by the organic light emitting diode 503 on the active layer of the first transistor T1, thereby avoiding generating a photogenerated leakage current in the first transistor T1 to affect sensitivity of the piezoresistive detection of the first switching transistor T1.

For example, in the display panel provided by the embodiment, when the switching transistor 501 and the driving transistor 502 are bottom gate type transistors, as shown in FIG. 11, a gate electrode of the switching transistor 501, a gate electrode of the driving transistor 502, a gate electrode of the first transistor and a gate electrode of the second transistor T2 may be disposed in a gate metal layer 020 in a same layer, and the gate metal layer 020 may be disposed between the semiconductor layer 700 and the second electrode 010.

For example, the fixed resistor $R_B$ is disposed between the gate metal layer 020 and the second electrode 010; the second electrode 010 may partially overlap with the fixed resistor $R_B$, and partially overlap with the gate electrode of the first transistor T1 and be connected with each other through a via hole VH1, that is, the second electrode 010 and the gate electrode of the first transistor T1 are two different film layers.

For example, in the display panel provided by the embodiment, the first electrode 800 may be disposed in a source and drain metal layer 600, or in a gate metal layer 020 as shown in FIG. 11, thereby saving manufacturing process, which is not limited in the embodiment.

It should be noted that, the embodiment does not limit the type of the second transistor T2, and the second transistor T2 may be a top gate type transistor or a bottom gate type transistor. For example, the type of the second transistor T2 may be set to be same as these of the switching transistor 501 and the driving transistor 502, to save fabrication process.

For example, in the display panel provided by the embodiment, the fixed resistor $R_B$ may be made of a conductor having a large resistance, for example, indium tin oxide (ITO), etc., which is not limited in the embodiment.

An embodiment of the present disclosure further provides a display device 4000, as shown in FIG. 11, comprising the display panel 3000 provided by the embodiment of the present disclosure, and the display device may a mobile phone, a tablet computer, a television, a monitor, a laptop, a digital photo frame, a navigator, or any other product or component having a display function. For implementation of the display device, the embodiments of the display panel may be made to reference, which will be not repeated here.

The embodiments of the present disclosure provide a piezoresistive detection circuit, a piezoresistive detection substrate, a display panel and a display device. When the piezoresistive detection circuit acquires a pressure, the second transistor may be turned on by the scanning signal line, and at this time, an electric potential of the first node may control a voltage size of the first voltage signal terminal flowing through the first transistor, so as to control a magnitude of a voltage signal transmitted to the readline connected with the drain electrode of the second transistor, and thus pressure condition of the piezoresistive detection circuit may be determined by judging the magnitude of the voltage signal output from the readline, and influence of a threshold voltage of the first transistor on the read voltage signal may be eliminated by determining changes in the voltage signals read by the readline before being touched and after being touched, thereby, accuracy of detection may be improved. Moreover, the second transistor is turned on only during the acquisition detection, so that the piezoresistive detection circuit is actively detected, and is less susceptible to leakage current, thereby improving sensitivity of the pressure sensitive detection.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged or decreased, that is, the accompanying drawings are not drawn according to the actual scale. It should understood that, in the case in which a component or element such as a layer, film, region, substrate or the like is referred to be "on" or "under" another component or element, it may be directly on or under the another component or element or a component or element is interposed therebetween.

(3) In case of no conflict, embodiments of the present disclosure or features in one embodiment can be combined.

What are described above is related to the specific embodiments of the disclosure only and not limitative to the scope of the disclosure. The protection scope of the disclosure shall be based on the protection scope of the claims.

The invention claimed is:

1. A piezoresistive detection circuit, comprising:
a first transistor, a second transistor, a fixed resistor, and a pressure sensitive resistor;
wherein a first end of the fixed resistor is connected with a first voltage signal terminal, and a second end of the fixed resistor is connected with a first node;
a first end of the pressure sensitive resistor is connected with the first node, and a second end of the pressure sensitive resistor is grounded;
a gate electrode of the first transistor is connected with the first node, a source electrode of the first transistor is connected with a second voltage signal terminal, and a drain electrode of the first transistor is connected with a source electrode of the second transistor;
a gate electrode of the second transistor is connected with a scanning signal line, and a drain electrode of the second transistor is connected with a readline.

2. The piezoresistive detection circuit according to claim 1, wherein the first end and the second end of the pressure sensitive resistor are in a turned-off state when no pressure is applied, a resistance value of the pressure sensitive resistor decreases as a pressure applied to the pressure sensitive resistor is increased.

3. A piezoresistive detection substrate, comprising:
a base substrate, a plurality of piezoresistive detection circuits disposed in a detection region of the base substrate, a plurality of readlines and a plurality of scanning signal lines; wherein,
each of the plurality of piezoresistive detection circuits includes:
a first transistor, a second transistor, a fixed resistor and a pressure sensitive resistor;

wherein a first end of the fixed resistor is connected with a first voltage signal terminal, and a second end of the fixed resistor is connected with a first node;
a first end of the pressure sensitive resistor is connected with the first node, and a second end of the pressure sensitive resistor is grounded;
a gate electrode of the first transistor is connected with the first node, a source electrode of the first transistor is connected with a second voltage signal terminal, and a drain electrode of the first transistor is connected with a source electrode of the second transistor;
a gate electrode of the second transistor is connected with the scanning signal line, and a drain electrode of the second transistor is connected with the readline.

4. The piezoresistive detection substrate according to claim 3, wherein, the plurality of piezoresistive detection circuits are arranged in an array;
each column of the plurality of piezoresistive detection circuits is connected with a same readline, and each row of the piezoresistive detection circuits is connected with a same scanning signal line; or
each row of the piezoresistive detection circuits are is connected with a same readline, and each column of the piezoresistive detection circuits is connected with a same scanning signal line.

5. The piezoresistive detection substrate according to claim 3, further comprising:
a constant current source, an amplifier, and an analog to digital converter disposed in a non-detection region of the base substrate;
an output end of the amplifier is connected with an input end of the analog to digital converter.

6. The piezoresistive detection substrate according to claim 5, further comprising an acquiring circuit,
wherein the output end of the amplifier is connected with an input end of the acquiring circuit;
an output end of the acquiring circuit is connected with the input end of the analog to digital converter.

7. The piezoresistive detection substrate according to claim 6, wherein, the acquiring circuit includes: a switching member and a capacitor; wherein an end of the switching member is connected with the output end of the amplifier, and an other end of the switching member is used as an output end and grounded through the capacitor.

8. The piezoresistive detection substrate according to claim 6, wherein, a plurality of additional acquiring circuits are provided, each of the plurality of additional acquiring circuits includes components same as those in the acquiring circuit, a plurality of analog to digital converters are provided, each of the plurality of analog to digital converters includes components same as those in the analog to digital converter, one of all of the acquiring circuits is connected with one of all of the analog to digital converters.

9. The piezoresistive detection substrate according to claim 3, wherein, the first end and the second end of the pressure sensitive resistor are in a turned-off state when no pressure is applied, a resistance value of the pressure sensitive resistor decreases as a pressure applied to the pressure sensitive resistor is increased.

10. A display panel, comprising the piezoresistive detection substrate according to claim 3, and a plurality of pixel circuits disposed in a display region of the base substrate.

11. The display panel according to claim 10, wherein, a display region and the detection region of the base substrate are a same region;
each of the plurality of pixel circuits includes: a switching transistor, a driving transistor and an organic light emitting diode;
the organic light emitting diode is disposed on the switching transistor and the driving transistor;
source and drain electrodes of the switching transistor, source and drain electrodes of the driving transistor, source and drain electrodes of the first transistor, and source and drain electrodes of the second transistor are disposed in a source and drain metal layer in a same layer;
an active layer of the switching transistor, an active layer of the driving transistor, an active layer of the first transistor, and an active layer of the second transistor are disposed in a semiconductor layer in a same layer;
the source and drain metal layer is disposed between the semiconductor layer and the organic light emitting diode.

12. The display panel according to claim 11, wherein, the fixed resistor and the pressure sensitive resistor are disposed between the base substrate and the semiconductor layer;
the display panel further comprises:
a plurality of first electrodes connected with first ends of a plurality of fixed resistors that include the fixed resistor in a one-to-one correspondence relationship, each of the plurality of first electrodes is used as the first voltage signal terminal;
a ground electrode connected with a second end of one of a plurality of the pressure sensitive resistors;
a plurality of second electrodes respectively connected with a plurality of second ends of the fixed resistors including the second end of the fixed resistor and first ends of the plurality of pressure sensitive resistor in a one-to-one correspondence relationship, each of the second electrodes serving as a first node.

13. The display panel according to claim 12, wherein, the ground electrode, the pressure sensitive resistor, the second electrode, the fixed resistor and the first electrode are stacked on the base substrate sequentially.

14. The display panel according to claim 13, wherein, a gate electrode of the switching transistor and a gate electrode of the driving transistor are disposed in a gate metal layer in a same layer, the gate metal layer is disposed between the source and drain metal layer and the semiconductor layer;
the first electrode is disposed between the semiconductor layer and the fixed resistor;
each of the second electrodes partially overlaps with the fixed resistor, and a portion of the second electrode overlaps with an active layer of the first transistor and is used as a gate electrode of the first transistor.

15. The display panel according to claim 14, wherein, each of a plurality of first transistors that includes the first transistor further includes a floating gate electrode disposed in the gate metal layer.

16. The display panel according to claim 13, wherein, a gate electrode of the switching transistor, a gate electrode of the driving transistor, a gate electrode of the first transistor and a gate electrode of the second transistor are disposed in a gate metal layer in a same layer, and the gate metal layer is disposed between the semiconductor layer and the second electrode;
the fixed resistor is disposed between the gate metal layer and the second electrode;
the second electrode partially overlaps with the fixed resistor, and partially overlaps with a gate electrode of the first transistor and connected to the gate electrode of the first transistor through a via hole.

17. The display panel according to claim 16, wherein, each of the plurality of first electrodes is disposed in the gate metal layer.

18. A display device, comprising: the display panel according to claim 10.

* * * * *